(12) United States Patent
Willmeroth et al.

(10) Patent No.: US 7,968,919 B2
(45) Date of Patent: Jun. 28, 2011

(54) INTEGRATED CIRCUIT INCLUDING A CHARGE COMPENSATION COMPONENT

(75) Inventors: Armin Willmeroth, Augsburg (DE); Anton Mauder, Kolbermoor (DE); Stefan Sedlmaier, Munich (DE)

(73) Assignee: Infineon Technologies Austria AG, Villach (AT)

( * ) Notice: Subject to any disclaimer, the term of this patent is extended or adjusted under 35 U.S.C. 154(b) by 733 days.

(21) Appl. No.: 11/961,235

(22) Filed: Dec. 20, 2007

(65) Prior Publication Data
US 2008/0150073 A1 Jun. 26, 2008

(30) Foreign Application Priority Data

Dec. 21, 2006 (DE) .......................... 10 2006 061 994

(51) Int. Cl.
*H01L 29/66* (2006.01)
(52) U.S. Cl. .............................. 257/285; 257/E29.257
(58) Field of Classification Search .................. 257/285, 257/341, 492, 493, E21.418, E29.066, E29.257, 257/E29.262
See application file for complete search history.

(56) References Cited

U.S. PATENT DOCUMENTS

| | | | |
|---|---|---|---|
| 4,754,310 A | 6/1988 | Coe | |
| 5,216,275 A | 6/1993 | Chen | |
| 6,475,864 B1 * | 11/2002 | Sato et al. | 438/268 |
| 6,551,909 B1 * | 4/2003 | Fujihira | 438/510 |
| 6,630,698 B1 | 10/2003 | Deboy et al. | |
| 6,633,064 B2 * | 10/2003 | Auerbach et al. | 257/336 |
| 6,900,109 B2 * | 5/2005 | Onishi et al. | 438/419 |
| 7,576,393 B2 * | 8/2009 | Ono et al. | 257/341 |
| 2002/0060344 A1 | 5/2002 | Auerbach et al. | |
| 2003/0011039 A1 * | 1/2003 | Ahlers et al. | 257/493 |
| 2004/0051141 A1 | 3/2004 | Udrea | |

FOREIGN PATENT DOCUMENTS

| | | |
|---|---|---|
| DE | 10245049 | 4/2004 |
| DE | 102005048447 | 4/2007 |
| WO | 2006089725 | 8/2006 |

* cited by examiner

*Primary Examiner* — Colleen A Matthews
(74) *Attorney, Agent, or Firm* — Dicke, Billig & Czaja, P.L.L.C.

(57) ABSTRACT

A charge compensation component having a drift path between two electrodes, an electrode and a counterelectrode, and methods for producing the same. The drift path has drift zones of a first conduction type and charge compensation zones of a complementary conduction type with respect to the first conduction type. A drift path layer doping comprising the volume integral of the doping locations of a horizontal drift path layer of the vertically extending drift path including the drift zone regions and charge compensation zone regions arranged in the drift path layer is greater in the vicinity of the electrodes than in the direction of the center of the drift path.

2 Claims, 8 Drawing Sheets

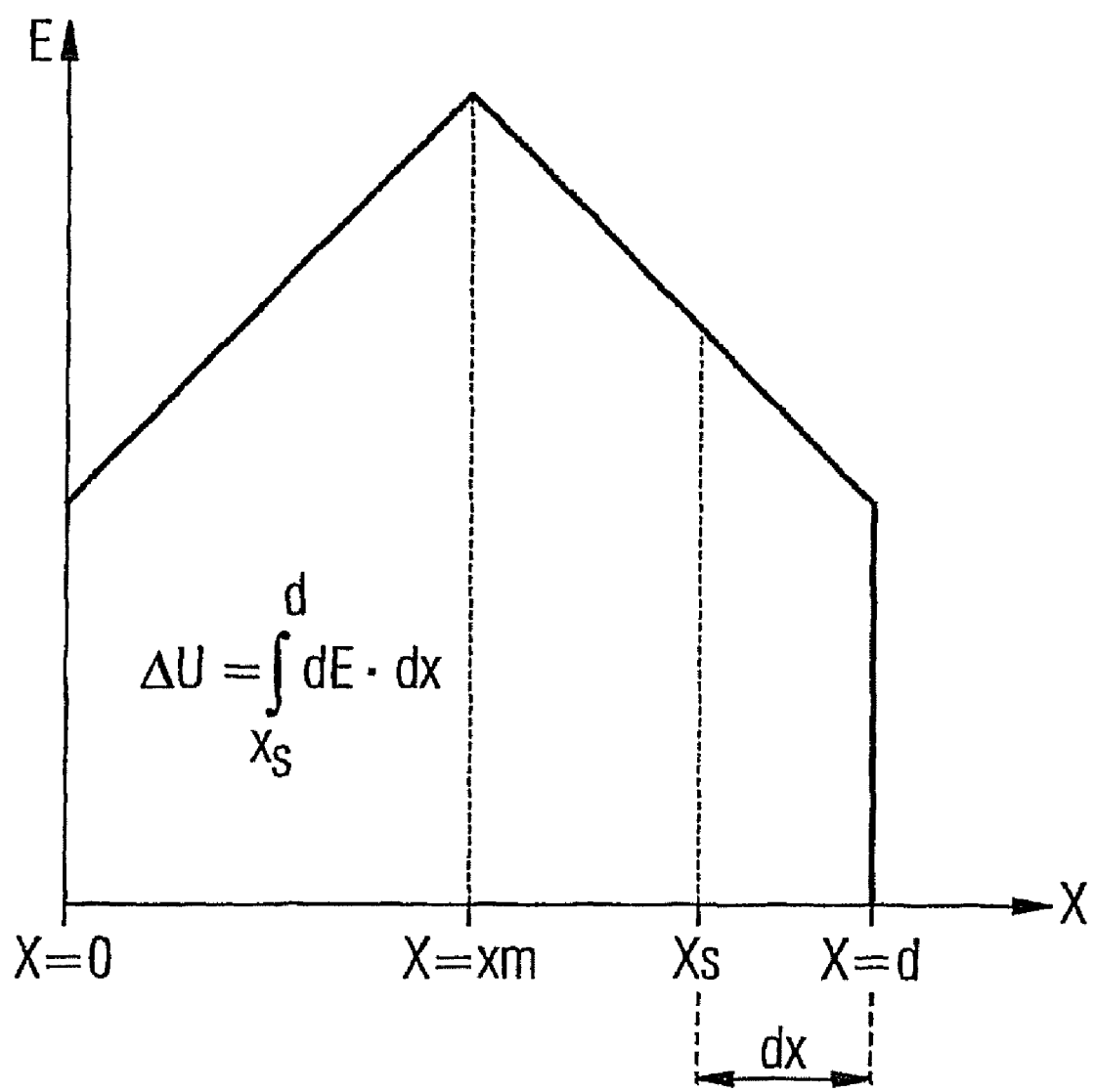

US 7,968,919 B2

INTEGRATED CIRCUIT INCLUDING A CHARGE COMPENSATION COMPONENT

CROSS-REFERENCE TO RELATED APPLICATIONS

This Utility Patent Application claims the benefit of the filing date of German Application DE 10 2006 061 994.3, filed Dec. 21, 2006, which is herein incorporated by reference.

BACKGROUND

This disclosure relates to a charge compensation component having a drift path between two electrodes, an electrode and a counterelectrode, and methods for producing the same. The drift path has drift zones of a first conduction type and charge compensation zones of a complementary conduction type with respect to the first conduction type.

Charge compensation components of this type are known from the documents U.S. Pat. Nos. 4,574,310 and 5,216,275. The charge compensation components proposed therein have a drift path with drift zones and charge compensation zones, which are referred to as composite buffer layer (CB) in the document U.S. Pat. No. 5,216,275. Such charge compensation components having depletable complementarily doped charge compensation zones in the form of complementarily doped regions (e.g., pillars). These regions require a very precise setting of the charge compensation since the breakdown voltage that can be achieved is sensitively dependent on the degree of compensation set, as illustrated by the document U.S. Pat. No. 6,630,698 with FIG. 7.

In particular a charge compensation component having a constant degree of compensation, such as is known from the documents U.S. Pat. Nos. 4,574,310 and 5,216,275, illustrates these severe fluctuations in the breakdown voltage. Manufacturing faults that occur e.g., as a result of geometrical tolerances of the photolithography masks and/or as a result of fluctuation tolerances of the implantation doses in the layer-by-layer doping of epitaxial layers for the drift path with drift zone regions and charge compensation zone regions in particular in the compensation-sensitive regions can therefore cause an effect, which can be alleviated in part by a variable doping of the charge compensation zones by the provision of a multipercent p-type overdoping or n-type underdoping of the charge compensation zone in the compensation-sensitive region near the pn junction with the electrode and, for balancing, a multipercent n-type overdoping or p-type underdoping of the charge compensation zone near the counterelectrode, as is known from the document U.S. Pat. No. 6,630,698 B1.

In this respect, FIG. 10 illustrates a diagram for the degree K of charge compensation between SOURCE and DRAIN as a function of the drift path depth. A given degree K of charge compensation can be formed, on the one hand, by a difference between high n-conducting and p-conducting dopings or, on the other hand, by a difference between two low dopings.

What is common to both profiles (solid and dashed lines) of the degree of compensation in FIG. 10 (remain constant or variable) is that as the doping increases, the absolute faults in the doping during the production process likewise increase. Although the relative faults remain the same (lithography, implantation or deposition of doped epitaxial layers), the absolute faults increase on account of the higher doping levels.

The influence of faults in the setting of the degree of compensation is not the same everywhere in the component. Therefore, it is possible by using a suitable design of the degree of compensation, to produce a component which is significantly less sensitive toward manufacturing fluctuations. The influence of the manufacturing faults will be explained in greater detail below. The profile of the electric field strength of a component whose degree of compensation corresponds to the dashed profile in FIG. 10 illustrates a roof-shaped profile as in FIG. 3. The relationship between degree of compensation and field strength is given by Gauss' law, according to which the change in the electric field strength is proportional to the charge. In the off-state case, all the doping atoms are ionized; this means that in a region with p-type dopant excess, there is an excess of negatively charged doping atoms: the electric field rises in this region. According to analogous consideration, it falls in a region with an excess of n-type doping atoms.

If a disturbance in the form of an additional p-type doping is then introduced in a region of the component, this means, in the off-state case, additional charge, which in turn results in a local field gradient, that is to say leads to a step in the field strength profile. For the sake of simplicity, a disturbance that is localized exactly at a depth x is considered. If the breakdown voltage is present at the component, the field strength in the centre of the component (as viewed from source to drain) is equal to the breakdown field strength in a constant fashion. The steps in the field strength profile which are illustrated in FIGS. 4A and 4B result depending on the position of the perturbation doping in proximity to the source or drain.

Since the voltage corresponds to the integral of the field strength, a disturbance in proximity to the drain brings about an increase in the reverse voltage by the magnitude $dE \cdot dx$, where dE is the height of the field strength step and dx is the distance between the step and the end of the space charge zone. The effect of such a disturbance on the breakdown voltage is therefore all the greater, the further the disturbance is from the end of the space charge zone. In other words: the component reacts more sensitively to disturbances in the degree of compensation in the centre (between source and drain), than in proximity to the source or drain.

One embodiment of the invention provides a charge compensation component having a first electrode, a counterelectrode and a drift path between the electrodes.

The drift path has drift zones of a first conduction type and charge compensation zones of a complementary conduction type with respect to the first conduction type. Furthermore, the drift path has a drift path layer doping including the volume integral of the doping locations of a horizontal drift path layer of the vertically extending drift path including the drift zone regions and charge compensation zone regions arranged in the drift path layer. This drift path layer doping is greater in the vicinity of the two electrodes than in the direction toward a central region of the drift path.

With this charge compensation component, the sensitivity toward manufacturing-dictated perturbation dopings is reduced in the region of the electrodes. The embodiment according to the invention of the drift path layer doping, which is lowest in a central region of the drift path and increases toward the two electrodes, results in an additional positive effect, namely that the breakdown characteristic curve has a reverse voltage reserve in the avalanche case, such that the "snap back effect" commences in delayed fashion.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 illustrates a schematic diagram of the profile of the electric field strength along the drift path.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
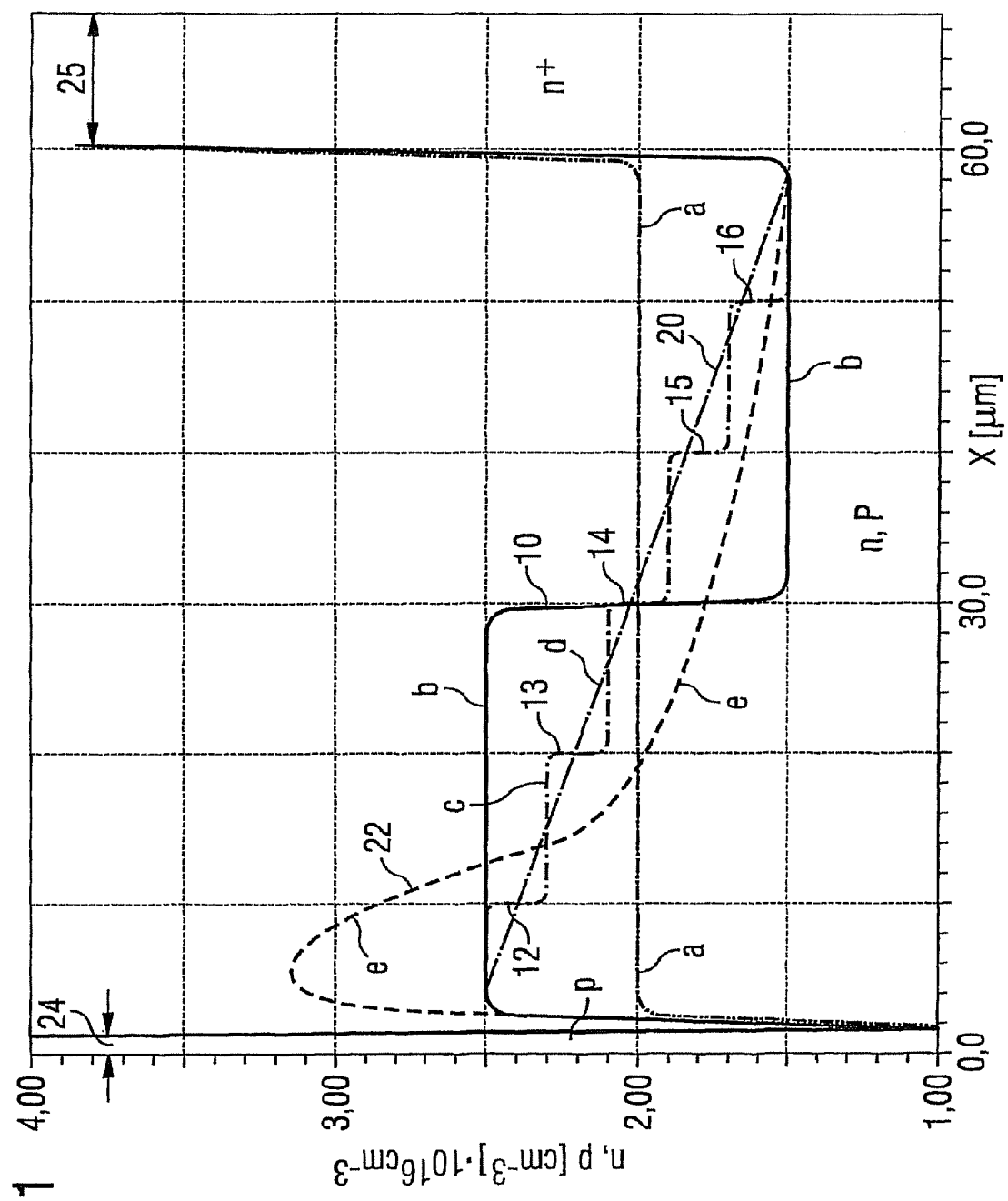
FIG. 1 illustrates a schematic diagram of dopant profiles of a drift path of a first embodiment of the invention.

FIG. 1 illustrates a schematic diagram of dopant profiles b to e of a drift path of an embodiment of the invention in comparison with a dopant profile a in accordance with the prior art according to document U.S. Pat. No. 5,216,275. The dopant concentration or the resultant charge carrier concentration of the first conduction type n in the drift zones and of the complementary conduction type p in the charge compensation zones per cubic centimeter is plotted on a linear scale on the ordinate. The penetration depth x in micrometers (μm) for the drift path is specified on the abscissa.

In this diagram, the surface structure of a charge compensation component is arranged in the region near the surface, the dopant profiles of the structure being illustrated only partially. Thus, in the region near the surface, adjacent to the dopant profiles of the drift path which are illustrated here there is a complementarily conducting (p) body zone 24 doped with approximately $10^{17}$ cm$^{-3}$ and situated near the depth x=0 to x=0.3 μm there is a highly doped n$^+$-conducting source terminal zone in the semiconductor body with $10^{19}$ cm$^{-3}$ to $10^{20}$ cm$^{-3}$ of the first conduction type, which cannot be represented in practice on the scale chosen here in FIG. 1. The dopant concentration a in accordance with the prior art according to document U.S. Pat. No. 5,216,278 is constant as far as an exemplary penetration depth of approximately x=60 μm both for the drift zones having the first conduction type n and for the charge compensation zones having the complementary conduction type p and amounts for example to $2 \cdot 10^{16}$ cm$^{-3}$. It is not until at the substrate region 25, which commences here at a depth of approximately x=60 μm, that the doping abruptly undergoes transition to a highly doped n$^+$-conducting material.

By contrast, the dopant profiles b to e according to the invention in the case of this embodiment of the invention are configured in such a way that they have a higher dopant concentration in the vicinity of the pn junction with the base zone 24 than at the junction with the substrate region 25, where they fall below the level of the dopant concentration of the prior art. What is thereby achieved is that a high tolerance with regard to the doping location concentration is possible in the vicinity of the pn junction with the body zone 24 without such faults in the dopant concentration having a serious effect on the properties of the charge compensation semiconductor component. Manufacturing-dictated perturbation dopings can thus be tolerated into the region of the pn junction between base zone and drift path in the region near a top side electrode.

In accordance with this embodiment, from there the dopant concentration in the drift path falls either by an individual jump in the central region of the drift path, as illustrated by the dopant profile b, or in steps 12 to 16, as illustrated by the dopant profile c, or linearly, as illustrated by the dash-dotted line of profile d, or in hyperbolic form, that is to say that the decrease in the dopant profile is inversely proportional to the penetration depth, as illustrated by the dopant profile e.

The number of charge carriers n and p within a portion of the drift path in the form of a drift path layer is also balanced in the dopant profiles b to e according to the invention, that is to say that the number of majority charge carriers of the first conduction type n in the drift path layer of the drift zone is equal to the number of majority charge carriers of the complementary conduction type p in the corresponding drift path layer of the charge compensation zones. This dopant profile nevertheless permits a high difference between the number of majority charge carriers of the first conduction type n and the majority charge carriers of the second, complementary conduction type p, such that these diverge from one another within a drift path layer doping since, as already mentioned above, deviations from the dopant profiles for n and p illustrated here in the dopant profile curves b to e are possible without serious impairment of the properties of the charge compensation semiconductor component.

Figure 2:
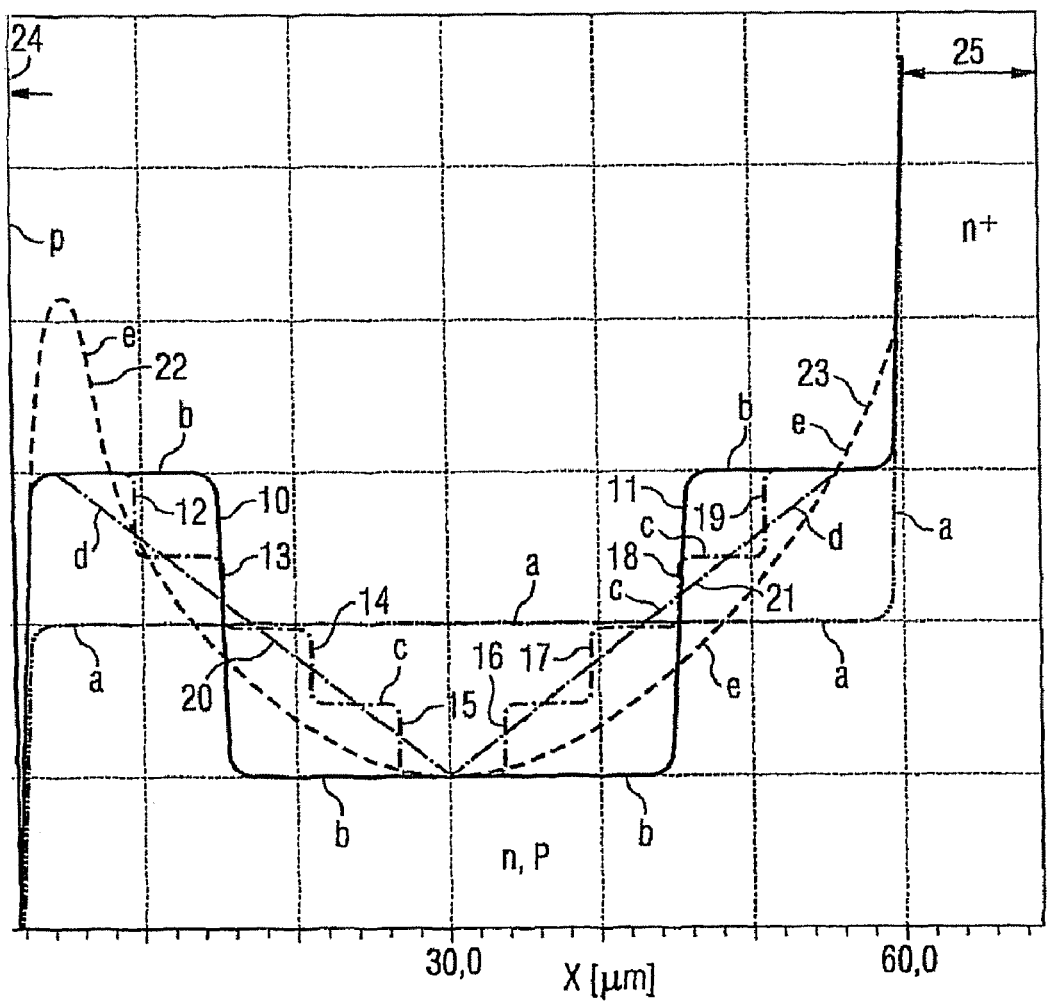
FIG. 2 illustrates a schematic diagram of dopant profiles of a drift path of a second embodiment of the invention.

FIG. 2 illustrates a schematic diagram of dopant profiles b to e of a drift path of a second embodiment of the invention. The dopant profile a in accordance with the prior art is also depicted as a comparison profile in FIG. 2. Relative to this profile of the dopant concentration in the prior art, the disclosed dopant profiles illustrate an elevated amount of dopant in a region at x≈0 near the electrode and an elevated amount of the dopant concentration in the region x=60 μm near the counterelectrode. Whereas an elevated amount of dopant in comparison with the prior art is provided in regions near the electrodes, an underdoping is provided in a central region in this example at approximately x=30 μm. The course of the various dopant profiles b to e can once again be provided by in each case an individual abrupt change 10 and 11 in the dopant concentration or be effected by a stepped change in the dopant concentration in steps 12 to 19. A linear change or a hyperbolic change, as illustrated by the dopant curves b and e, respectively, is also advantageous for absorbing manufacturing-dictated perturbation dopings.

FIG. 3 illustrates a schematic diagram of the profile of the electric field strength along the drift path between source and drain, and has already been discussed in the introductory part.

Figure 4A:
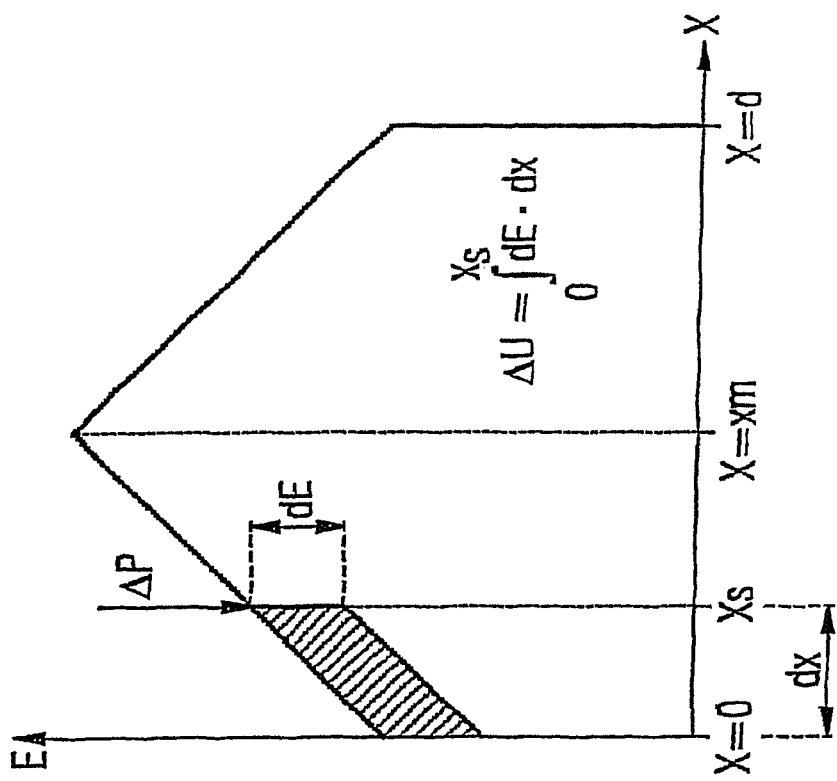
FIG. 4 illustrates a schematic diagram of the profile of the electric field strength along the drift path when a manufacturing-dictated perturbation doping occurs in the vicinity of electrodes.

FIG. 4a illustrates a schematic, greatly simplified diagram of the profile of the electric field strength E along the drift path when a manufacturing-dictated perturbation doping Δp occurs in the vicinity of a counterelectrode of a charge compensation component according to the invention. On account of the dopant profiles illustrated in FIGS. 1 and 2, a maximum of the field strength E is produced in the central region of the drift path at $x=x_m$. If a manufacturing-dictated perturbation doping Δp then occurs, for example, the field strength increases at this location by dE for a region between the depth $x=x_s$, at which the perturbation doping Δp occurs, as far as a region x=d, the end of the drift path to the transition to the substrate region. The associated change in the reverse voltage ΔU results from the integral over $x_s$ to d for dE·dx and therefore leads to a limited voltage reserve in the off-state case in the region of the counterelectrode.

If an incorrect doping (which in FIG. 3 is a perturbation doping in the form of an unintended, spatially non-extended Δp doping) is therefore introduced at the location $x_s$ (in the component this is a plane which is at a distance of $x_s$ from the front surface), then a field strength jump dE whose height is proportional to the magnitude of the perturbation charge occurs at this location. A corresponding gradient of the field strength arises, of course, in the case of an incorrectly doped region. Therefore, only the basic Δp doping was chosen above for the sake of simpler mathematical representation.

As a result of this perturbation charge, the breakdown voltage of the component increases by the voltage ΔU represented above. However, since this increase is not compensated for by an opposite decrease at the other end in the vicinity of the electrode of the component, such a disturbance has a greater effect than a general shift in the dopant level.

Figure 4B:
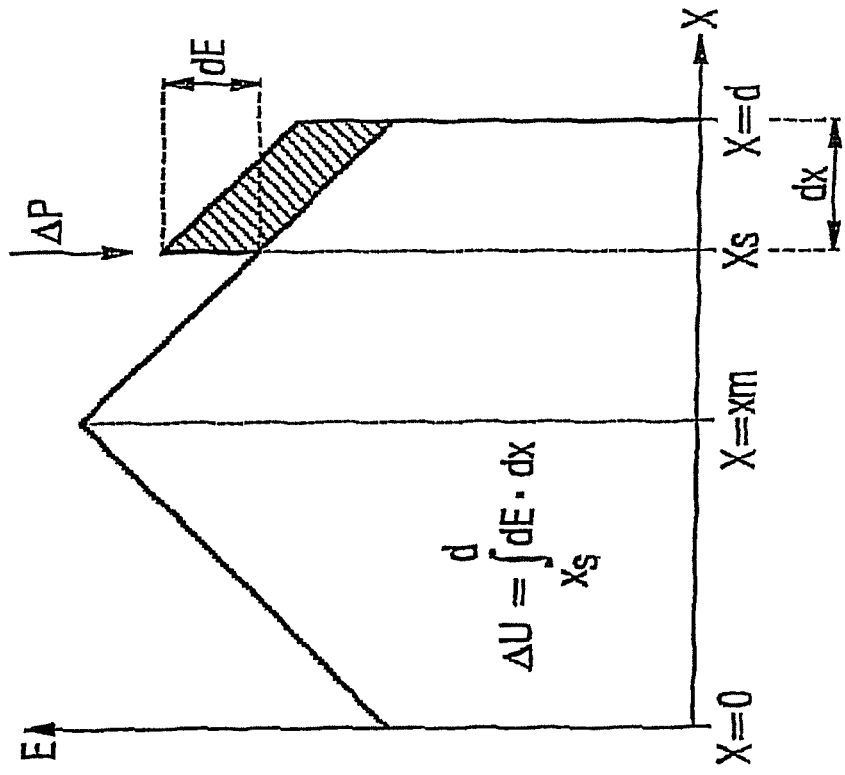

FIG. 4B illustrates a schematic diagram of a profile of the electric field strength E along the drift path when a manufacturing-dictated perturbation doping Δp occurs in the vicinity of an electrode of a charge compensation component according to the invention. In the vicinity of the electrode, such a perturbation doping Δp, as illustrated by FIG. 4B, leads to a decrease in the reverse voltage by $$\Delta U = \int_0^{x_s} dE \cdot dx.$$

This decrease in the reverse voltage as a result of perturbation doping Δp in the edge region with respect to the electrode improves the on resistance, which is thereby reduced. The decrease in the reverse voltage is slight, however, and can be tolerated if the drift path layer doping in the vicinity of the electrode is increased according to the invention.

The maximum field strength of the component is approximately 250 kV/cm. Therefore, a disturbance in the form of a Δp doping above the point for the maximum electric field strength leads to a decrease in the electric field towards smaller penetration depth values x. In this case, as already mentioned above, the breakdown voltage is lowered by the value ΔU. The magnitude of the breakdown voltage change is accordingly proportional to the perturbation charge Δp and proportional to the distance between the perturbation charge and the end of the space charge zone. This is the reason why disturbances in layers near the field strength maximum have a particularly high influence, which is reduced, however, by the variation of the drift path layer doping according to the present disclosure.

Figure 5:
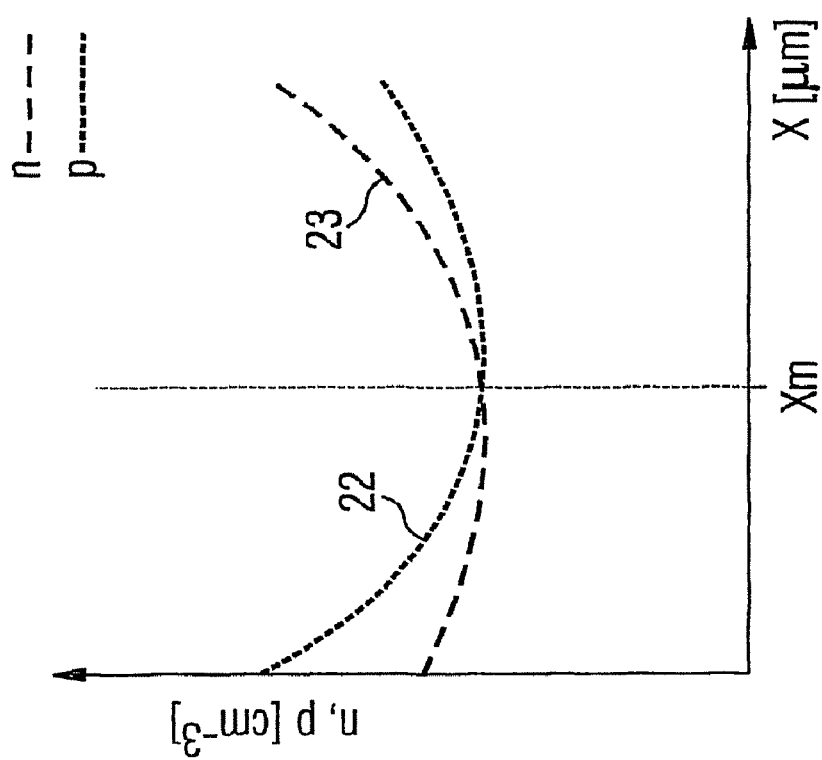
FIG. 5 illustrates a schematic diagram of the profile of charge carrier concentrations along the drift path with an individual abrupt change in the central region of the drift path.

FIG. 5 illustrates a schematic diagram of the profile of charge carrier concentrations n and p along the drift path with an individual abrupt change in the charge carrier concentration in the central region of the drift path and an otherwise linear profile 20 and 21 of the elevated amount of dopant toward the two regions near the electrode and the counterelectrode. If the increase in the edge regions and the decrease in the central region are coordinated with one another, then the on resistance (which is lower, of course, at a high doping level) remains unchanged. By contrast, the sensitivity toward manufacturing variations is reduced. The component can therefore be produced more reliably. At the same time, this profile of the charge carrier concentrations n and p illustrates the large tolerance range in the possible incorrect or perturbation doping.

Figure 6:
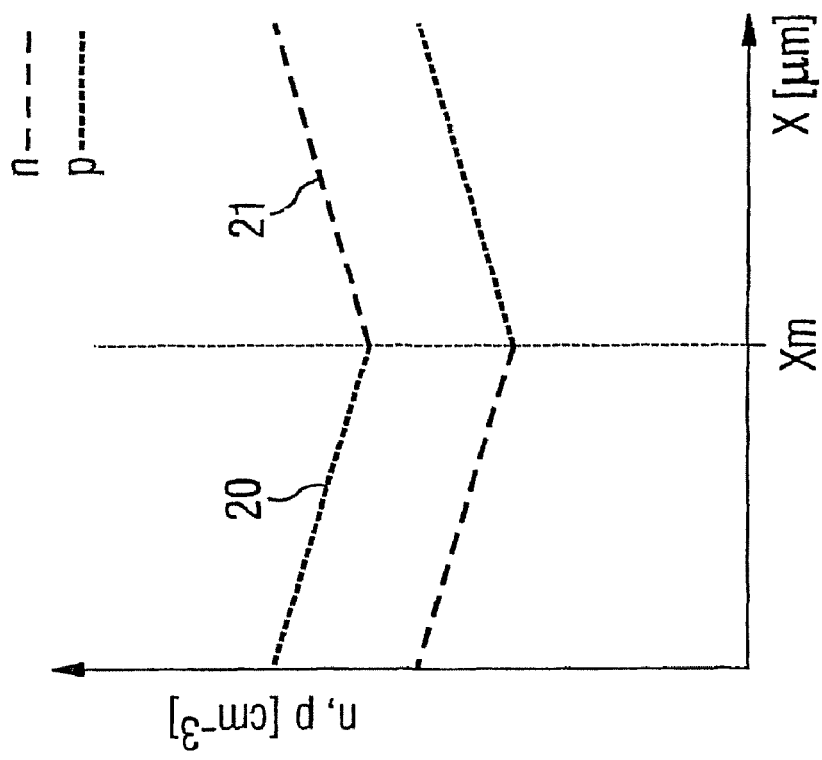
FIG. 6 illustrates a schematic diagram of the profile of the charge carrier concentration along the drift path with a hyperbolic change in the drift path doping.

FIG. 6 illustrates a schematic diagram of the profile of the charge carrier concentration n and p along the drift path with a hyperbolic change 22 and 23 in the drift path doping, wherein a minimum of the charge carrier concentrations n and p is provided in the central region of the drift path at $x=x_m$.

Figure 7:
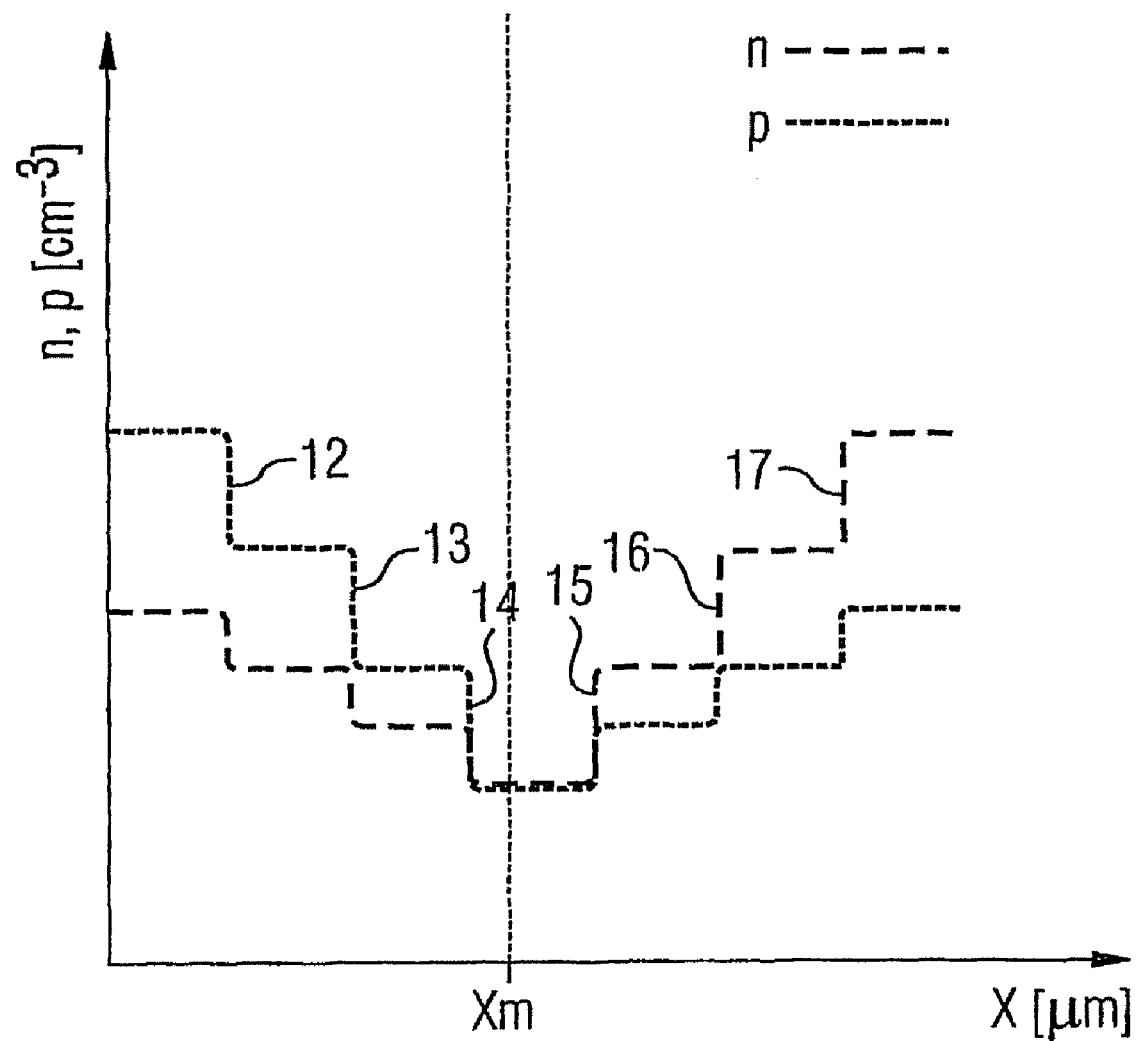
FIG. 7 illustrates a schematic diagram of the profile of charge carrier concentrations along the drift path with a stepped change in the drift path doping.

FIG. 7 illustrates a schematic diagram of the profile of charge carrier concentrations n and p along the drift path with stepped changes 12 to 17 in the drift path doping, wherein the charge carrier concentration is lowest in the central region at $x=x_m$ and is elevated at the start and at the end of the drift path. The effect is comparable, however, with the charge carrier concentration profile illustrated in FIG. 5, in which the dopant level is increased at locations that are particularly sensitive toward perturbation dopings. Most manufacturing fluctuations are dependent on the dopant level. Thus, resist dimension fluctuations in lithography and implantation fluctuations bring about disturbances that are proportional to the target implantation dose. Consequently, a decrease in the dopant level brings about a proportional reduction of the breakdown voltage variation. In a counterpart action, the dopant level can be increased at locations having lower sensitivity such as in regions lying nearer to the edges of the space charge zone.

Figure 8:
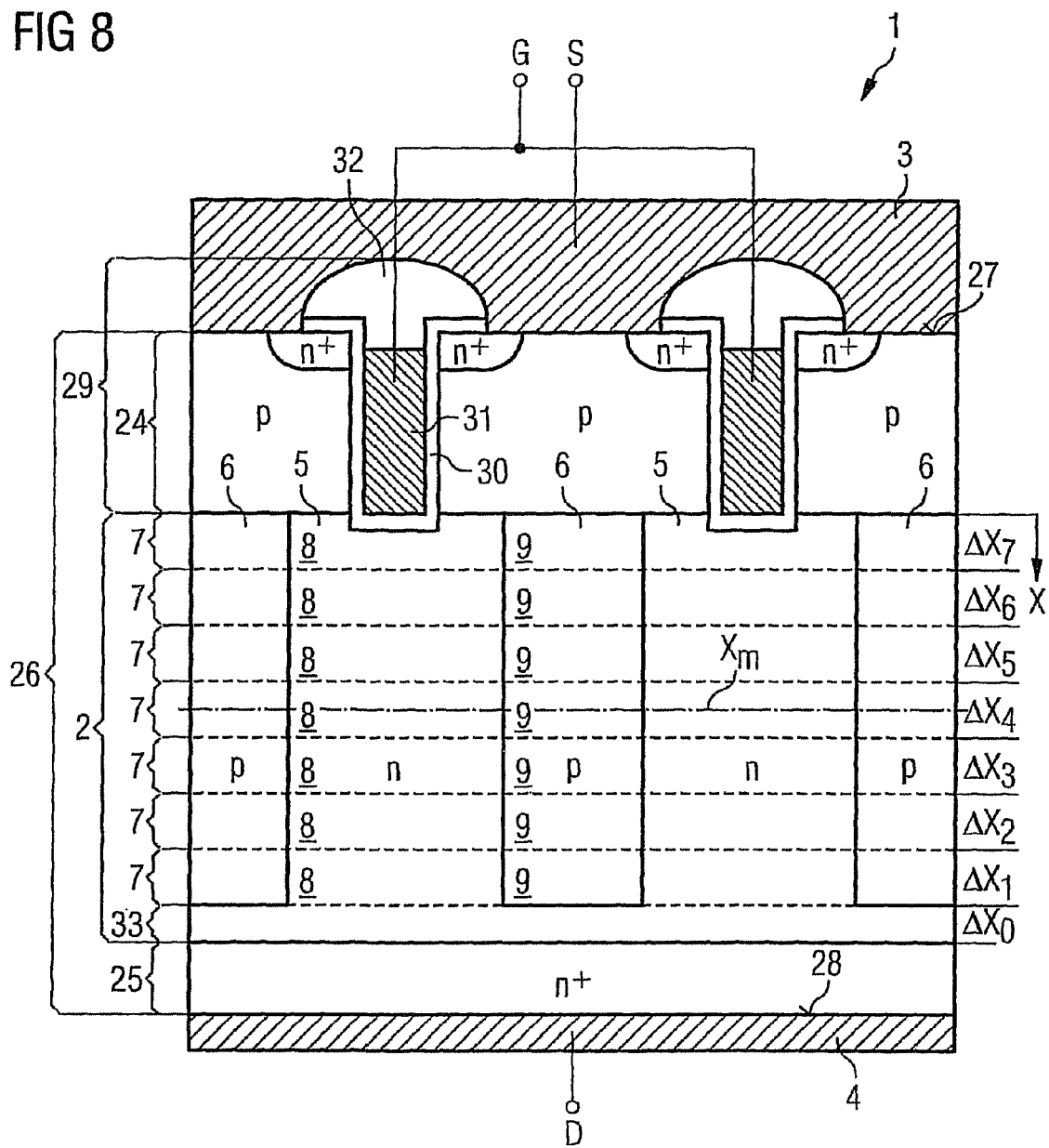
FIG. 8 illustrates a schematic cross section through a charge compensation component with drift path in accordance with one embodiment of the invention.

FIG. 8 illustrates a schematic cross section through an example of an integrated circuit including a charge compensation component 1 with drift path 2 in accordance with one embodiment of the invention. The charge compensation component 1 has a semiconductor body 26 having a top side 27 and a rear side 28, the semiconductor body having a top side structure 29, in which a vertical gate structure is arranged in a body zone 24 in this example of the invention. Adjacent to the complementarily conducting body zone 24 is the drift path 2 having complementarily conducting charge compensation zones 6 and drift zones 5 of the first conduction type. Finally, the drift zone 5 also has a buffer zone 33, and then undergoes transition to the $n^+$-conducting substrate region 25, adjacent to which the counterelectrode 4 in the form of a drain terminal D. The top side structure 29 has the electrode 3 alongside the body zone 24 and the vertical gate structure composed of gate oxide 30 and buried gate electrode material 31 with an insulation cap 32, which shields the gate structure from a source electrode S.

The drift path 2 has a variable drift path layer doping having in the individual drift path layers 7 for example in the vicinity of the pn junction between body zone 24 and drift path 26 a higher drift path layer doping than in a central region of the drift path 2 at a depth of the drift path 2 of $x=x_m$, to be precise both in the drift zone regions 8 and in the charge compensation zone regions 9. From the central region in the vicinity of the depth $x=x_m$, by way of example, the drift path layer doping then increases again as far as the buffer zone 33 on the substrate region 25. The advantages of the variable drift path layer doping in the drift paths 7 composed of drift zones 5 and charge compensation zones 6 are discussed in detail above with reference to FIGS. 1 to 7 and are not listed again at this juncture, in order to avoid repetition.

Such a variation of the drift path layer doping can be carried out using the conventional methods for the production of charge compensation components, by a procedure in which, as in this example in FIG. 8, a plurality of epitaxial layers from $\Delta x_0$ to $\Delta x_7$ are deposited successively on the substrate region 25 and the dose of the implanted dopants is varied in this case. This results in a stepped fall and also rise again in the charge carrier concentration from the substrate region via a central region at $x=x_m$ to the body zone 24 illustrated here of this charge compensation component 1.

Figure 9:
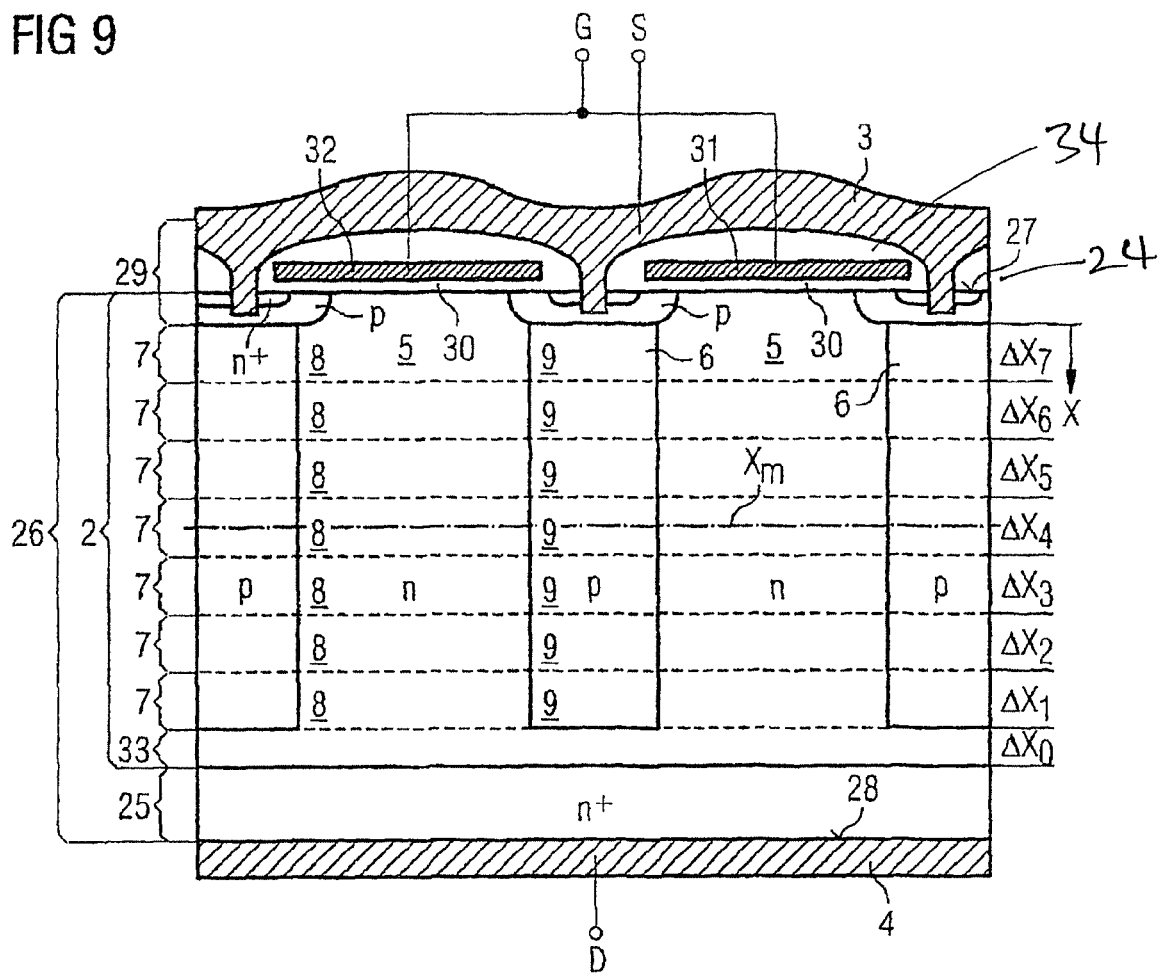
FIG. 9 illustrates a schematic cross section through a charge compensation component with drift path in accordance with a further embodiment of the invention.
Figure 10:
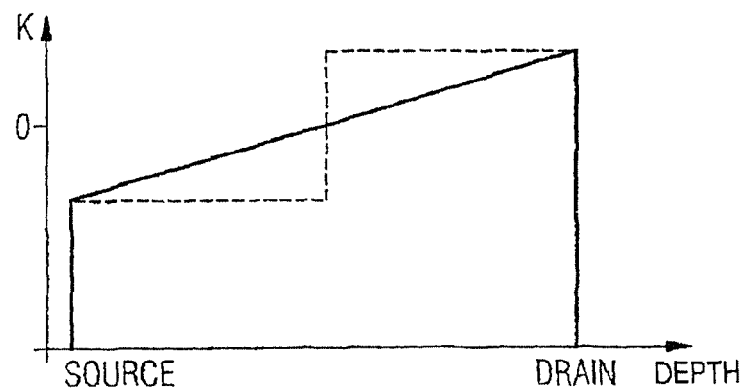
FIG. 10 illustrates a diagram for the degree of charge compensation in power semiconductor components in accordance with the prior art.

FIG. 9 illustrates a schematic cross section through a charge compensation component 35 with drift path in accordance with a further embodiment of the invention. The charge compensation component 35 has a semiconductor body 26 having a top side 27 and a rear side 28, the semiconductor body having a top side structure 29, in which a lateral gate structure 34 with a gate oxide 30 is arranged over a body zone 24 in this example of the invention. Adjacent to the complementarily conducting body zone 24 is the drift path 2 having complementarily conducting charge compensation zones 6 and drift zones 5 of the first conduction type. Finally, the drift zone 5 also has a weakly doped buffer zone 33, and then undergoes transition to the n⁺-conducting substrate region 25, adjacent to which is the counterelectrode 4 in the form of a drain terminal D. The top side structure 29 has the electrode 3 alongside the body zone 24 and the lateral gate structure 34 composed of gate oxide 30 and buried gate electrode material 31 with an insulation cap 32, which shields the gate structure from a source electrode S.

According to the invention, the drift path 2 has a variable drift path layer doping having in the individual drift path layers 7 for example in the vicinity of the pn junction between body zone 24 and drift path 26 a higher drift path layer doping than in a central region of the drift path 2 at a depth of the drift path 2 of $x=x_m$, to be precise both in the drift zone regions 8 and in the charge compensation zone regions 9. From the central region in the vicinity of the depth $x=x_m$, by way of example, the drift path layer doping then increases again as far as the buffer zone 33 on the substrate region 25. The advantages of the variable drift path layer doping in the drift paths 7 composed of drift zones 5 and charge compensation zones 6 are discussed in detail above with reference to FIGS. 1 to 7 and are not listed again at this juncture, in order to avoid repetition.

Such a variation of the drift path layer doping can be carried out using the conventional methods for the production of charge compensation components, by a procedure in which, as in this example in FIG. 9, a plurality of epitaxial layers from $\Delta x_0$ to $\Delta x_7$ are deposited successively on the substrate region 25 and the dose of the implanted dopants is varied in this case. This results in a stepped fall and also rise again in the charge carrier concentration from the substrate region via a central region at $x=x_m$ to the body zone 24 illustrated here of this charge compensation component 35.

Such a charge compensation component 1 in the form of a MOS power semiconductor component illustrated here with a source terminal S as electrode 3 and a drain terminal D as counterelectrode 4 is, however, only one example from a plurality of technically possible charge compensation components such as a high-power and/or high-voltage diode with an anode as electrode and a cathode as counterelectrode or an IGBT transistor (insulated gate bipolar transistor) with an emitter as electrode and a collector as counterelectrode.

In a further embodiment of the invention, the drift path doping has a decreasing doping from the regions in the vicinity of the two electrodes lying opposite one another toward the central region of the drift path. This can be achieved by an abrupt change in the central region from a p-type overdoping or n-type underdoping to an n-type overdoping or p-type underdoping, respectively. An abrupt change in the drift path layer doping in the drift path can be produced in a relatively unproblematic manner by layer-by-layer growth of the epitaxy for the drift path.

A stepped decrease, in the dopant concentration both in the drift zones and in the charge compensation zones proceeding from the two regions near the electrodes and decreasing toward the central region, can also be produced in an unproblematic manner in terms of manufacturing technology with the aid of the epitaxy that is grown layer by layer and selectively doped for the drift path. This dopant profile is also associated with the advantage that manufacturing-dictated perturbation dopings both in the region near the electrode and in the region near the counterelectrode can be tolerated without a significant impairment of the functional properties and characteristic curves of the charge compensation component.

It is also possible to realize a drift path layer doping which provides, from the regions in the vicinity of the two electrodes lying opposite one another toward the central region of the drift path, in each case a linear decrease both in the drift zones and in the charge compensation zones. In a further embodiment of the invention, the drift path layer doping has, from the regions in the vicinity of the two electrodes lying opposite one another toward the central region of the drift path, in each case a virtually trough-shaped decrease both in the drift zones and in the charge compensation zones.

A further embodiment of the invention relates to a charge compensation component having a drift path between two electrodes, namely an electrode and a counterelectrode, wherein the drift path has drift zones of a first conduction type and charge compensation zones of a complementary conduction type with respect to the first conduction type. In this embodiment of the invention, a drift path layer doping as already defined above is greater in the vicinity of the electrode than in the direction toward the counterelectrode. In this case, the doping location concentrations both in the drift zones and in the charge compensation zones decrease from the electrode toward the counterelectrode.

For this purpose, the underlying dopant concentration is significantly higher in the vicinity of the electrode than in the vicinity of the counterelectrode, which permits a higher manufacturing tolerance in the drift path region sensitive to perturbation dopings in the vicinity of the electrode, that is to say that manufacturing faults which occur have a lesser effect. In the regions which are critical for perturbation doping, both overdopings and underdopings can be coped with better than in the case of conventional charge compensation components.

In a further embodiment of the invention, the drift path layer doping has, from the region in the vicinity of the electrode in the direction toward the counterelectrode, an individual abrupt decrease in the drift path layer doping in the form of a single step both in the drift zones and in the charge compensation zones. Such an individual abrupt decrease can be arranged for example in the central region of the drift path, such that the drift path layer doping is significantly higher in the region in the vicinity of the electrode than in a region in the vicinity of the counterelectrode. This is associated with the advantage that manufacturing-dictated perturbation dopings in the sensitive region of the pn junction for example between the body zone near the electrode and the drift zone of a MOS power semiconductor component do not lead to a functional failure of the power semiconductor component.

As an alternative, a stepped decrease can also be provided instead of an individual abrupt decrease in the drift path doping. The stepped decrease complies with the manufacturing technique of drift paths in charge compensation components if the drift path is produced by growing non-doped epitaxial layers. In this case, in each epitaxial layer, donors and acceptors for the drift zone regions of the first conduction type and also the charge compensation regions of the complementary conduction type are selectively implanted and subsequently diffused. In this case, the implantation dose can be increased from the first epitaxial layer on the substrate with an underdoping in a stepwise manner with each subsequent epitaxial layer up to an overdoping of the last epitaxial layer to be applied. After the application of a top side structure to the top side of the semiconductor body composed of drift path and substrate, therefore, a stepped decrease in the drift path layer doping has been achieved from the electrode on the top side of the semiconductor body in the direction of the substrate or in the direction of the counterelectrode, each of the steps corresponding to the doping of an epitaxial layer.

In a further embodiment of the invention, the drift path layer doping has, from the region in the vicinity of the electrode in the direction toward the counterelectrode a linear decrease of the drift path layer doping both in the drift zones and in the charge compensation zones. Such a linear decrease can be achieved if a longer diffusion phase is provided during layer-by-layer application of an epitaxial layer and selective doping of the epitaxial layer, for example by implantation, after completion of the drift path, such that a dopant gradient is formed from the last epitaxial layer, which is located nearest the electrode, to the epitaxial layer grown first, which is located near the counterelectrode.

In a further embodiment of the invention it is provided that the drift path layer doping has, from the region in the vicinity of the electrode in the direction toward the counterelectrode a continuous nonlinear decrease of the drift path layer doping both in the drift zones and in the charge compensation zones. Such a virtually hyperbolic decrease in the doping decreases with the reciprocal of the penetration depth of the drift path from a region in the vicinity of the electrode to a region in the vicinity of the counterelectrode. This means that the fall in the drift path layer doping is greatest in the region in the vicinity of the electrode and slowly tails off toward the counterelectrode. In the case of this profile of the drift path layer doping, the initial elevated amount of the doping in the vicinity of the electrode is significantly higher than in the case of the previously discussed profiles of the drift path doping decrease within the drift path.

The drift path can have a manufacturing-dictated perturbation doping of the complementary conduction type in the vicinity of the electrode and a manufacturing-dictated perturbation doping of the first conduction type in the vicinity of the counterelectrode without this leading to considerable impairments of the characteristics of the charge compensation component. The opposite case is also possible, in which the drift path has a manufacturing-dictated perturbation doping of the first conduction type in the vicinity of the counterelectrode.

The drift zones and the charge compensation zones along the drift path are for example oriented parallel to one another. This enables an optimum compensation by the charge compensation zones or an optimum constriction of the current path in the drift zones in the off-state case of the charge compensation component. This parallel orientation of the drift zones and of the charge compensation zones is achieved by the growth of a non-doped epitaxial layer and the subsequent selective doping of the drift zones and of the charge compensation zones, particularly when the diffusion coefficients of donors for the first conduction type in the drift zones and of acceptors for the complementary conduction type in the charge compensation zones are identical.

The variable drift path layer doping disclosed herein can be used for charge compensation components in which a drift path is arranged between a body zone of a MOS power semiconductor component and a semiconductor substrate. Furthermore, it is possible to use the profile according to the invention of the drift path layer doping for a drift path between an anode region and a cathode region of a power or high-voltage diode. In all four cases of use, the higher tolerance toward perturbation dopings now enables the charge compensation components to be manufactured more robustly.

A method for producing a charge compensation includes providing a doped substrate region for a semiconductor body with top side and rear side. Afterward, doped epitaxial layers of a first conduction type are grown in alternation with selective doping of the doped epitaxial layers for charge compensation zones with a complementary conduction type. In this case, a drift path layer doping including the volume integral of the doping locations of a horizontal drift path layer of the vertically extending drift path including the drift zone regions and charge compensation zone regions arranged in the drift path layer is increased from the first epitaxial layer grown onto the substrate region to the last epitaxial layer grown for the drift path onto the substrate region both in the doped epitaxial layer for the drift zones and in the regions of the charge compensation zones.

In addition, a top side structure and/or a rear side structure are/is produced in and/or on the semiconductor body in order to complete the charge compensation component. Finally, electrodes are applied to the top side structure and to the rear side structure or the rear side of the semiconductor body.

A further method for producing a charge compensation component includes providing a doped substrate region for a semiconductor body with top side and rear side. Afterward, undoped epitaxial layers are grown in alternation with selective doping of the epitaxial layers for a drift path with drift zones of a first conduction type and charge compensation zones of a complementary conduction type, wherein a drift path layer doping including the volume integral of the doping locations of a horizontal drift path layer of the vertically extending drift path including the drift zone regions and charge compensation zone regions arranged in the drift path layer is increased from the first epitaxial layer grown onto the substrate region to the last epitaxial layer grown for the drift path onto the substrate region. The growth of such a drift path is followed by the production of a top side structure and/or of a rear side structure on the semiconductor body and/or in the semiconductor body in order to complete the charge compensation component. The electrodes can then be applied to the top side structure and to the rear side structure or the rear side of the semiconductor body.

This production method has the advantage that all the method processes can be carried out for a plurality of charge compensation components on a semiconductor wafer as substrate region. This parallel production reduces the production costs. Furthermore, this production method has the advantage that tried and tested semiconductor-technological production methods can be used, merely with the difference that now the drift path layer dopings in each of the epitaxial layers to be applied for the drift path, both in the drift zone regions and in the charge compensation zone regions, are varied in accordance with the stipulation according to the invention.

An alternative production method likewise proceeds from the provision of a doped substrate region, but the undoped epitaxial layers are fashioned by selective doping into a drift path in which the drift path layer doping is reduced from the first epitaxial layer grown onto the substrate region up to a central epitaxial layer and is increased again from the central epitaxial layer to the last epitaxial layer for the drift path. In this case, too, the production of the drift path can be followed by the production of a top side structure and/or of a rear side structure in and/or on the semiconductor body in order to complete the charge compensation component. Finally, the electrodes are then applied to the top side structure and to the rear side structure or to the rear side of the semiconductor body if no rear side structure is available.

In order to realize the different drift path layer dopings provided in the charge compensation components according to the invention, either individual abrupt changes in the drift path doping are performed or a stepped change in the drift path doping is carried out or a linear change or else a hyperbolic change in the drift path doping is performed. A doping method that has proved successful is the implantation of donor ions for the first conduction type and acceptor ions for the complementary conduction type, such as phosphorous and boron, respectively, into the semiconductor body, where implantation energies E between $1.5 \text{ MeV} \leq E \leq 20 \text{ MeV}$ are used. For the subsequent diffusion of the donor ions and of the acceptor ions into the semiconductor crystal, temperatures T in the range of $900° \text{C.} \leq T \leq 1100° \text{C.}$ have proved successful for the indiffusion of the donor ions and acceptor ions and for the recrystallization of the single-crystal lattice disturbed by the ion implantation.

Finally, the substrate region of the semiconductor wafer can be thinned in order to complete a charge compensation component chip in the chip positions of the semiconductor wafers. This has the advantage that the forward resistance can be lowered again.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit including a charge compensation component comprising:
   a first electrode;
   a counterelectrode; and
   a vertically extending drift path between the electrodes with;
      drift zones of a first conduction type; and
      charge compensation zones of a complementary conduction type with respect to the first conduction type; and
      a drift path layer doping comprising a volume integral of doping locations of a horizontal drift path layer of the vertically extending drift path including the drift zone regions and charge compensation zone regions arranged in the drift path layer; and
   wherein the drift path layer defines a doping profile in which portions of the drift path layer adjacent the first electrode and the counterelectrode have a first doping level, and a portion of the drift path layer in a central region between the first electrode and the counterelectrode has a second doping level, and wherein the first doping level is higher than the second doping level such that doping levels at a beginning and an end of the drift path are higher than a doping level at a center of the drift path, wherein the doping profile linearly increases from the second doping level to the first doping level.

2. The integrated circuit of claim 1, wherein the drift path layer doping comprises, from the first doping level to the second doping level a linear decrease both in the drift zones and in the charge compensation zones.

* * * * *